United States Patent [19]
Sun et al.

[11] Patent Number: 6,091,197
[45] Date of Patent: Jul. 18, 2000

[54] FULL COLOR TUNABLE RESONANT CAVITY ORGANIC LIGHT EMITTING DIODE

[75] Inventors: Decai Sun, Sunnyvale; Raj B. Apte, Palo Alto, both of Calif.

[73] Assignee: Xerox Corporation, Stamford, Conn.

[21] Appl. No.: 09/096,326

[22] Filed: Jun. 12, 1998

[51] Int. Cl.[7] .................................... H01J 1/62
[52] U.S. Cl. .................... 313/509; 313/506; 313/508; 313/498; 257/98; 257/99
[58] Field of Search .................. 313/498–512, 313/113; 257/98, 99

[56] References Cited

U.S. PATENT DOCUMENTS

| | | | |
|---|---|---|---|
| 5,401,983 | 3/1995 | Jokerst et al. | 257/82 |
| 5,793,485 | 8/1998 | Gourley | 356/318 |
| 5,969,475 | 10/1999 | Friend et al. | 313/506 |

*Primary Examiner*—Nimeshkumar D. Patel
*Assistant Examiner*—Matthew J. Gerike
*Attorney, Agent, or Firm*—Oliff & Berridge, PLC

[57] ABSTRACT

A full-color, tunable organic light emitting diode (RCOLED) includes a high-reflection tunable membrane and a high-reflection dielectric mirror that form a resonant cavity. A white light OLED is located in the resonant cavity. The high-reflection tunable membrane is moved to alter the resonant cavity length, and/or tilted/bowed to change the finesse of the resonant cavity. In this way, color, brightness and color saturation of the emitted light from the RCOLED can be tuned. The RCOLED may also include a microlens structure to improve off-axis viewing.

27 Claims, 9 Drawing Sheets

FULL COLOR TUNABLE RESONANT CAVITY ORGANIC LIGHT EMITTING DIODE

BACKGROUND OF THE INVENTION

1. Field of Invention

The present invention relates to a tunable organic light emitting diode. More particularly, this invention is directed to a full-color tunable resonant cavity organic light emitting diode (RCOLED).

2. Description of Related Art

Visible organic light emitting diodes (OLEDs) have attracted a great deal of attention recently for applications such as color display and printing. Large area OLED arrays are a potential alternative to active matrix liquid crystal displays (AMLCDs). The advantage of OLEDs derives principally from the lack of polarizers, color filters and alignment layers which compliment the AMLCD assembly. These polarizers, color filters and alignment layers reduce the efficiency of the AMLCDs in producing emitted light.

To increase the efficiency of OLEDs, resonant cavity structures have been used to spatially and spectrally redistribute the electro-luminescence of organic materials utilized in the OLEDs. Light emission in the forward direction from a RCOLED can be increased by as much as four times over that emitted from a non-cavity OLED. Additionally, the spectral width of the RCOLED is much narrower than that of a non-cavity OLED. A narrower spectral width provides a purer color in the forward direction along the viewing axis of the OLED.

Conventionally, a red/green/blue tri-element side-by-side array of RCOLEDs has been used for color display applications. The red/green/blue tri-element side-by-side RCOLED array uses resonant cavity structures in which each element has a different cavity length to produce a specific color.

FIG. 1 shows a typical RCOLED 100. The RCOLED 100 includes a glass substrate 110, a high-reflection quarter-wave stack 120, a contact layer 130, a hole transport layer 140, an emitting medium 150, an electron transport layer 160 and an electrode 170. The high-reflection quarter-wave stack 120 is preferably formed of dielectric layers such as $SiO_2/TiO_2$. The contact layer 130 is preferably indium tin oxide (ITO) and is electrically coupled to the electrode 170. The hole transport layer 140 is preferably formed of triphenyl diamine (TAD). The emitting medium 150 and the electron transport layer 160 are preferably formed of 8-hydroxyquinoline aluminum (Alq). The electrode 170 is preferably formed of aluminum. The resonant cavity of the RCOLED 100 is formed by the quarter-wave stack 120 and the electrode 170. In operation, in the RCOLED 100, light is emitted through the glass substrate 110. The effective resonant cavity length determines the on-axis resonant wavelength produced by the RCOLED 100.

FIG. 2 shows the electro-luminescent spectra produced by a RCOLED such as the RCOLED 100 illustrated in FIG. 1. FIG. 2 shows the electroluminescence spectra of the RCOLED measured at 0, 10, 20, 30 and 40 degrees from a line normal to the surface of the substrate 110. The light intensity at 0° is greatly enhanced over the light intensity of a non-cavity OLED. However, the intensity of the produced light drops off quickly along the off-axis directions, e.g., 10, 20, 30 and 40 degrees from the normal line. Additionally, there is a spectral shift associated with the off-axis directions. These effects are problematic for display applications where a wide viewing angle is preferred.

SUMMARY OF THE INVENTION

One drawback of the red/green/blue tri-element side-by-side RCOLED array is the amount of device space necessary to produce the full range of emitted colored light. Ideally, three colors should be produced by one element alone using a color tuning capability.

This invention provides a tunable RCOLED that can be tuned to emit a selected color of light.

This invention further provides a full-color, tunable RCOLED that can be tuned to output red, green or blue light. This invention additionally provides a full-color, tunable RCOLED that can be tuned to output at a selected finesse and Q.

This invention also provides a full-color, tunable RCOLED that can be tuned electronically.

This invention additionally provides an active matrix array of full-color, tunable RCOLEDs usable to display a full-color image. This invention further provides an active matrix, full-color, tunable RCOLED array that uses only one RCOLED element per full-color image pixel. The full-color tunable RCOLED according to this invention includes a high-reflection tunable membrane and a high-reflection dielectric mirror forming a resonant cavity in which a white light OLED is located. The high-reflection tunable membrane is moved to alter the resonant cavity length, and/or tilted/bowed to change the finesse and Q of the resonant cavity. In this way, each of the color, the brightness and the color saturation of the light emitted by the RCOLED, according to this invention, can be tuned independently. The RCOLED according to this invention is well-suited for color display and printing applications. The RCOLED, according to this invention, can also incorporate a microlens structure to improve off-axis viewing applications for large area two-dimensional arrays used in display applications.

These and other features and advantages of this invention are described in or are apparent from the following detailed description of the preferred embodiments. The fully tunable RCOLED may be included in apparatuses, for example, but not limited to, scanners, facsimile machines, printers and digital copiers using, for example, raster output scanners or image bar scanners, or any apparatus presently using light emitting diodes. Further, the RCOLED may be included in display apparatuses, for example, but not limited to, active or passive matrix displays, flat panel displays or any display apparatus presently using light emitting diodes.

BRIEF DESCRIPTION OF THE DRAWINGS

This invention will be described in detail, with reference to the following figures, wherein.

DETAILED DESCRIPTION OF PREFERRED EMBODIMENTS

Figure 1:
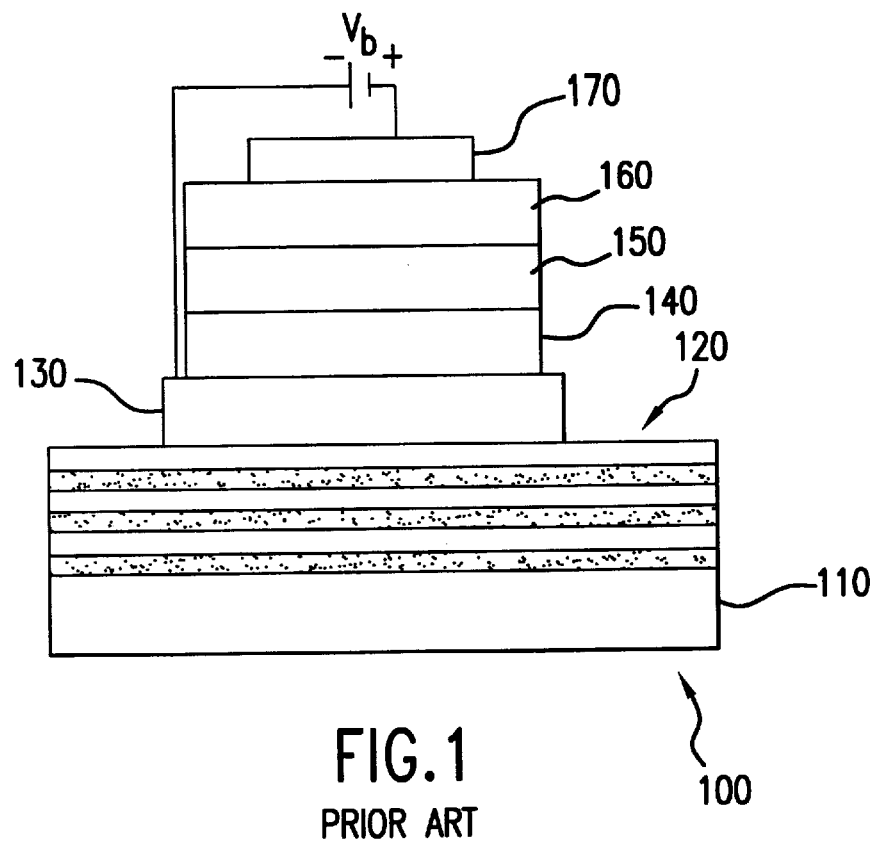
FIG. 1 illustrates a conventional RCOLED device.
Figure 2:
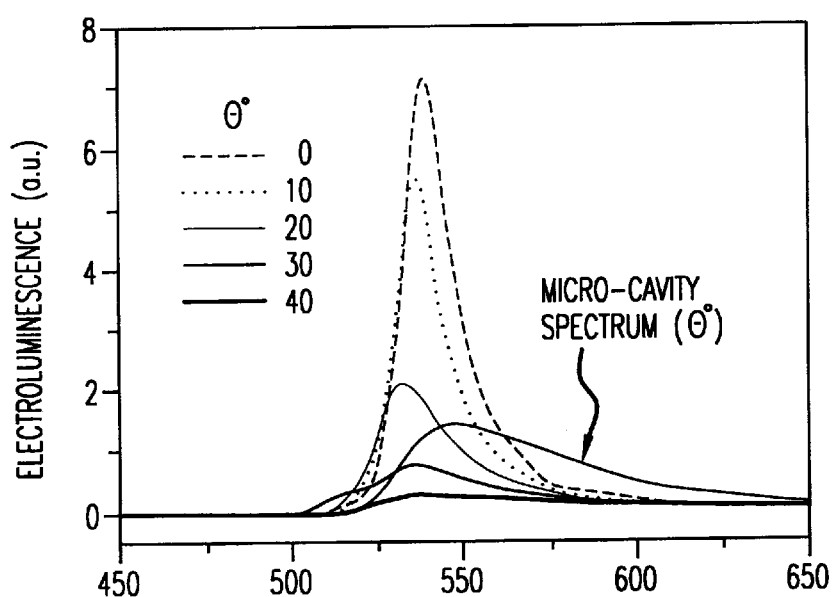
FIG. 2 illustrates the electro-luminescent spectra from a conventional RCOLED device.
Figure 3:
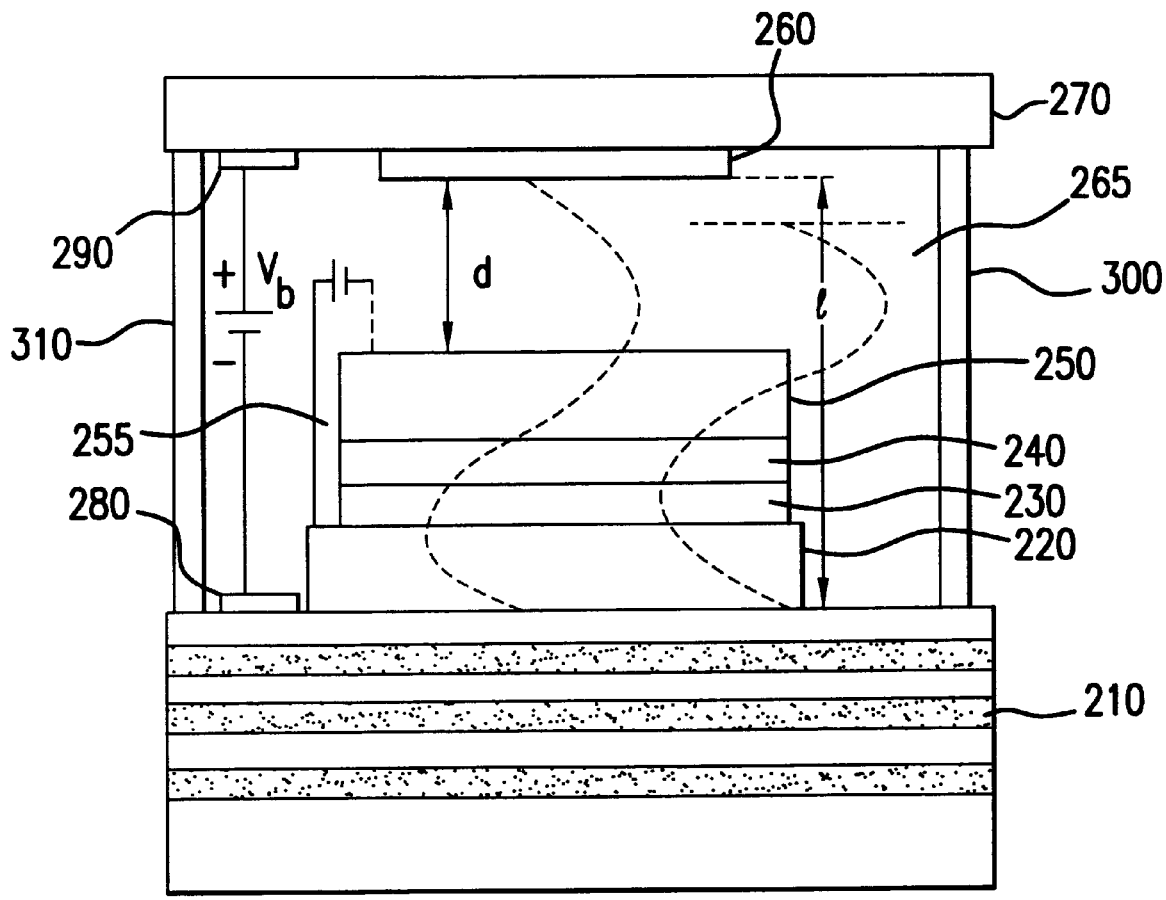
FIG. 3 illustrates a tunable RCOLED according to a first embodiment of the invention.

FIG. 3 illustrates a tunable RCOLED 200 according to a first embodiment of the present invention. The tunable RCOLED 200 is capable of emitting red, green, and blue light and achieving color saturation. The RCOLED 200 comprises a glass substrate 205, a high-reflection quarter-wavelength mirror stack 210, an indium tin oxide (ITO) layer 220, an emitting medium 230, a hole transport layer 240 and an electrode 250. A highly reflective Al reflector 260 is attached to a membrane 270. Electrodes 280 and 290 are attached to the quarter-wavelength mirror stack 210 and the membrane 270, respectively. The membrane 270 is made of, for example, polysilicon and is conductive. Alternatively, the membrane 270 could be made of aluminum doped with copper. The aluminum doped with copper could be deposited with controllable tension. The electrodes 280 and 290 are provided to electrically couple the membrane 270 and the quarter-wavelength stack 210, which is normally electrically isolated from the membrane 270. The electrode 250 is also made of ITO, which is transparent.

Pillars 300 and 310 are connected to and support the membrane 270. The pillars 300 and 310, the quarter-wavelength mirror stack 210 and the membrane 270 form a resonant cavity. In the resonant cavity, the layers 220–250 of the RCOLED 200 form a white light OLED 255, which is used as the emitter for the RCOLED 200.

The cavity length of the cavity 265, i.e., the distance between the quarter-wavelength stack 210 and the Al reflector 260, is adjustable, i.e., tunable, using a bias voltage Vb applied to the electrodes 280 and 290 to apply an electrostatic force between the membrane 270 and the quarter-wavelength mirror stack 210. The dielectric quarter-wavelength mirror stack 210 is made of, for example, $SiO_2/TiO_2$. The Al reflector 260 is attached to the membrane 270. The quarter-wavelength mirror stack 210 and the Al reflector 260 form a resonant cavity which contains the white light OLED. ITO used to form the ITO layer 220 and the electrode 250, is a transparent conductor and has hole injection characteristics. ITO is used on both sides of the emitting medium 230 and the hole transport layer 240 combination because those layers are in the middle of the cavity and light needs to pass through in both directions. The hole transport layer 240 and the emitting medium 230 are organic. The hole transport layer 240 is made of TAD. The emitting medium 230 is made of a material such as Alq.

Alternatively, the RCOLED may be fabricated such that the quarter-wavelength mirror stack 210 is located on the movable element such as the membrane 270 and the Al electrode 260 is fixed on the substrate 205.

The resonant emission peak wave length in the resonant cavity 265 is determined by the effective cavity length 1' which is a theoretical value determined by the cavity length 1 and the phase modulation from the quarter-wavelength mirror stack 210, the phase modulation from the emitting structure (220, 230, 240, and 250) and the Al reflector 260. The membrane 270 moves up and down in the vertical direction by applying the electrical static force to the membrane 270 induced by the bias voltage $V_b$ across the electrodes 280 and 290 attached to the quarter-wavelength mirror stack 210 and the membrane 270, respectively. By moving the membrane 270 up and down, the Al reflector 260 moves relative to the quarter-wavelength mirror stack 210, which varies the cavity length 1 and the effective cavity length 1'. As the position of the membrane 270 is adjusted, the air gap d also varies.

Figure 4:
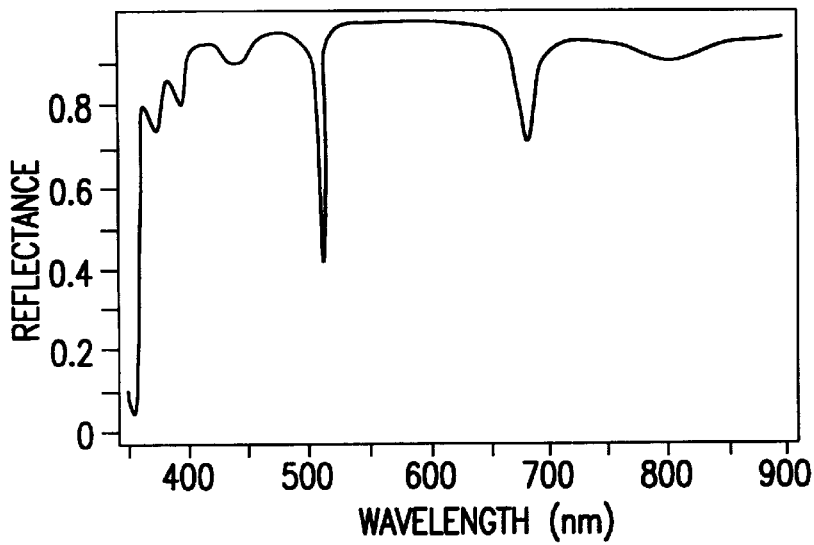
FIG. 4 illustrates the modeled tunability of RCOLED of FIG. 3 with an air gap of 180 nanometers.
Figure 5:
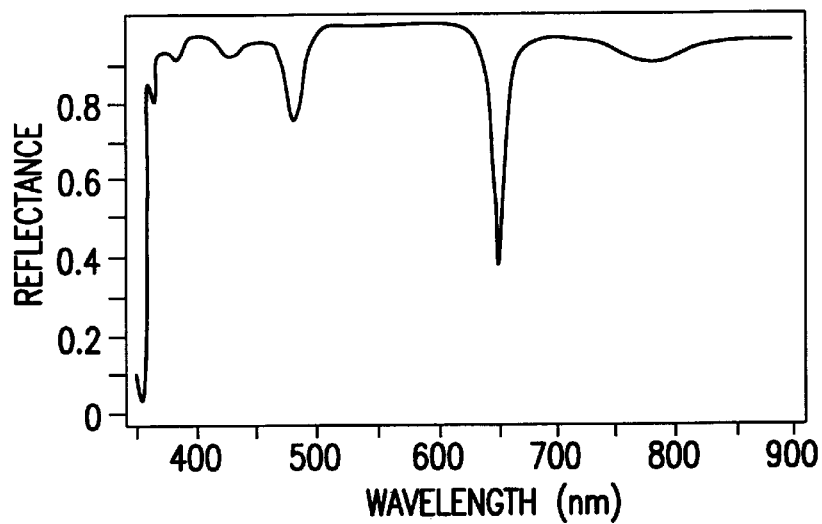
FIG. 5 illustrates the modeled tunability of the RCOLED of FIG. 3 with an air gap of 90 nanometers.
Figure 6:
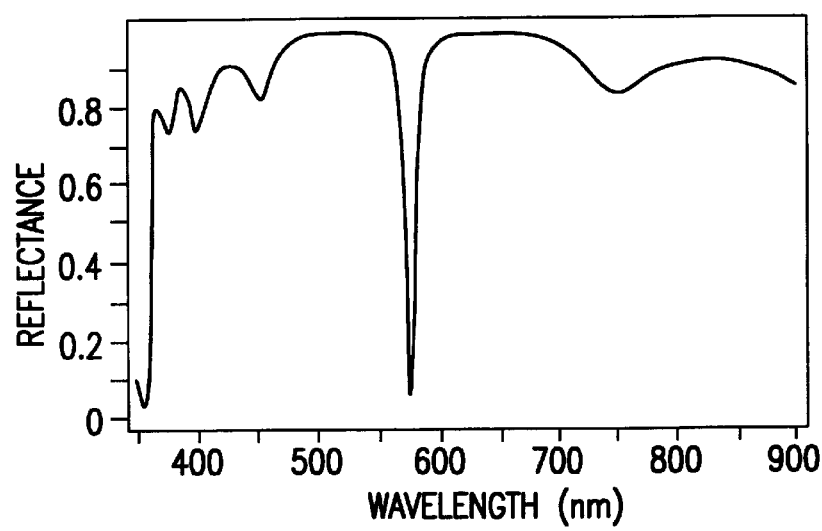
FIG. 6 illustrates the modeled tunability of the RCOLED of FIG. 3 with an air gap of 0 nanometers.

FIGS. 4–6 illustrate the model tunability of the RCOLED 200 by illustrating the reflectance spectrum, i.e., the amount of light reflected within the resonant cavity 265 and thus not transmitted out of the resonant cavity, of the resonant cavity 265 through the glass substrate 205. Although FIGS. 4–6 show the reflectance spectrum relative to the air gap d, it should be noted that reducing the air gap d corresponds to reducing the cavity length 1 and the effective cavity length 1'.

As shown in FIGS. 4–6, the color of the light not reflected within, and thus emitted by, the RCOLED 200 is tuned from red to blue as the resonant effective cavity length 1' is shortened by increasing the bias voltage. The determined reflectance shown in FIG. 4 was modeled for an air gap d of 180 nm. The main, but not dominant, resonant reflectance valley, i.e., emission peak, produced with this air gap is located at 680 nm. A satellite, but dominant, reflectance valley, is located at 510 nm. That is, the satellite reflectance valley is significantly more intense then the main resonant reflectance valley. Therefore, the dominant emission peak is 510 nm, which is close to the wavelength for blue light. Therefore, even though the main resonant emission peak is at 680 nm, the gain of the emissive layer at the main resonant peak is much smaller then the gain at the satellite peak located at 510 nm. Therefore, the satellite peak dominates the emission produced by the RCOLED's 200 resonant cavity 265 and the emitted light is predominantly blue.

FIG. 5 illustrates the determined reflectance when the air gap d is reduced to 90 nm. The reduced cavity length 1 shifts the main and dominant reflectance valley, i.e., emission peak, to 660 nn. The satellite and minor, reflectance valley, or emission peak, also shifts to 480 nm. The gain of the resonant peak is significantly increased while the gain on the satellite peak is decreased relative to the peaks obtained when the air gap d was 180 nm. As a result, the dominant emission peak of the RCOLED 200 is at 660 nm, which is close to the wavelength for red light. Therefore, the emitted light is predominantly red.

FIG. 6 illustrates the determined reflectance when the air gap d is reduced to 0 nm. Reducing the cavity length 1 shifts the dominant reflectance valley, i.e., emission peak, to 575 nm. The gain of the minor satellite reflectance valley, i.e., emission peak, previously located 480 nm is further decreased by reducing the cavity length. As a result, the dominant emission peak is at 575 nm which is close to the wavelength for green light. Therefore, by adjusting the cavity length 1 by tuning the bias voltage on the electrodes 280 and 290 to tune the relative position of the membrane 270, the RCOLED 200 is capable of producing red, green, and blue spectra.

The spectral width of the emitted light is determined by the finesse of the resonant cavity 265. The resonant cavity finesse is affected by the product of the reflectivities of the top and bottom mirrors, i.e., the quarter-wavelength mirror stack 210 and the Al reflector 260. The higher the product of the reflectivities, the narrower the width of the emission spectrum. If the two mirrors are parallel, the finesse of the resonant cavity 265 is relatively constant as the membrane 270 is tuned up and down.

If the membrane 270 itself is optically reflective, the membrane 270 should be a few hundred nanometers thick and should be able to bend by 180 nm to provide color saturation. If the entire membrane 270 is reflective and is bowed, so that the membrane 270 does not stay parallel with the quarter-wavelength stack 210, the Q and finesse decrease as the membrane 270 moves out of parallel with the quarter-wavelength stack 210, as the air gap d is reduced.

Figure 7:
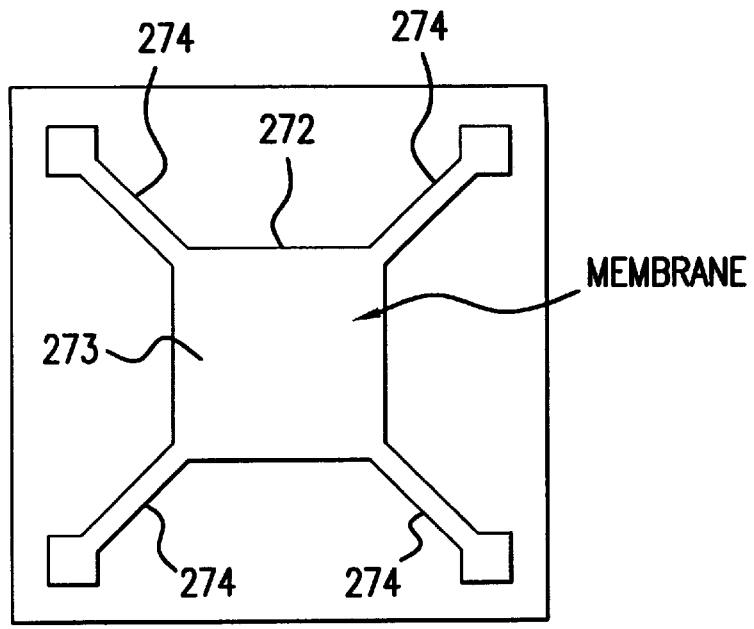
FIG. 7 illustrates an alternative layout for the membrane utilized in the RCOLED of FIG. 3.
Figure 8:
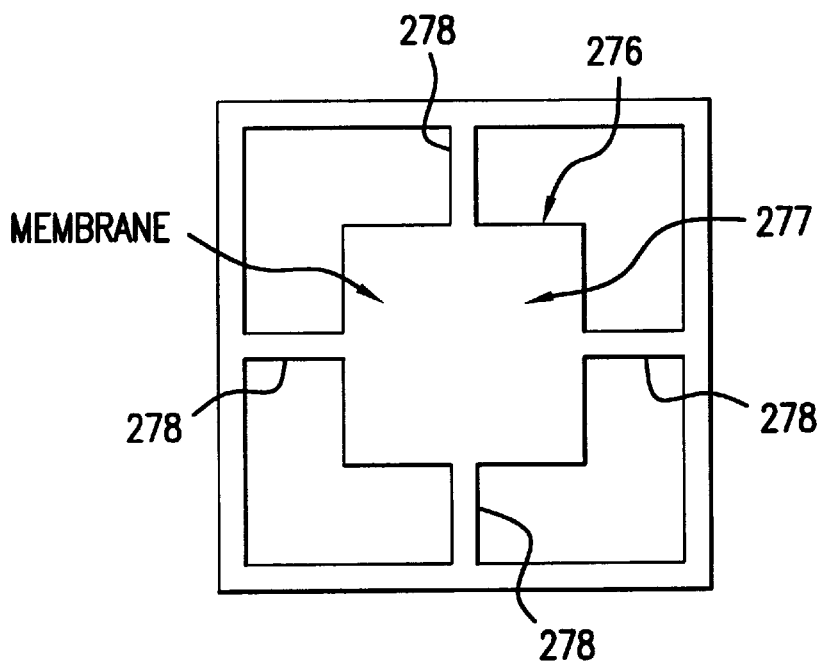
FIG. 8 illustrates a second alternative layout for the membrane utilized in the RCOLED of FIG. 3.

Although the membrane 270 may constitute a solid piece of material which completely covers the resonant cavity 265, the membrane 270 may also be designed to provide more flexibility to vary the cavity length 1 while ensuring that the membrane 270 and the quarter-wavelength mirror stack 210 remain parallel to each other. For example, FIGS. 7 and 8 illustrate alternative membranes 272 and 276. As shown in FIG. 7, the membrane 272 may include a central portion 273 and a plurality of side arms 274 connected to the corners of the central portion 273. Following RCOLED fabrication, the side arms 274 also connect to the pillars 300 and 310. The Al reflector 260 is connected to the central region 273. Alternatively, FIG. 8 shows a membrane 276 also including a central portion 277 attached to a plurality of side arms 278. However, in the membrane 276 the side arms 278 are attached to the midsection of each of the sides of the central portion 277. Similarly, the side arms 278 are also connected to a mid-section of a frame 279, which is connected to the pillars 300 and 310. The Al reflector 260 is connected to the central region 277. If the membranes 272 or 276 is bowed and the Al reflector 260 positioned on the central regions 273 or 277 stays parallel to the quarter-wavelength stack 210, then the Q and the finesse remain the same as the membrane 272 or 276 moves vertically.

The solid membrane 270 may have a lower operating voltage than the membranes 272 and 276, making the solid membrane a more preferable structure. However, the membranes 272 and 276 illustrated in FIGS. 7 and 8 should be as good a quality as the solid membrane 270. These alternative membranes 272 and 276 may be used in order to more effectively maintain the quarter-wavelength mirror stack 210 and the Al reflector 260 in parallel while providing sufficient adjustment of the cavity length 1 to fully tune the RCOLED 200. The resonant cavity length 1 may be decreased by stretching the membrane 272 or 276 along the side arms 274 or 278 while maintaining the central portions 273 or 277 parallel to the quarter-wavelength mirror stack 210. This parallel positioning of the two mirrored surfaces 210 and 260 provides a relatively constant finesse of the resonant cavity 265 as the membrane 272 or 276 moves up and down. If the membranes 272 or 276 are made of a dielectric material, the electrodes 280, 285, 290 and 295 are relocated nearer to the central portion of the cavity and farther away from the pillars 300 and 310 so as to provide contact with the central portions 273 or 277.

Figure 9:
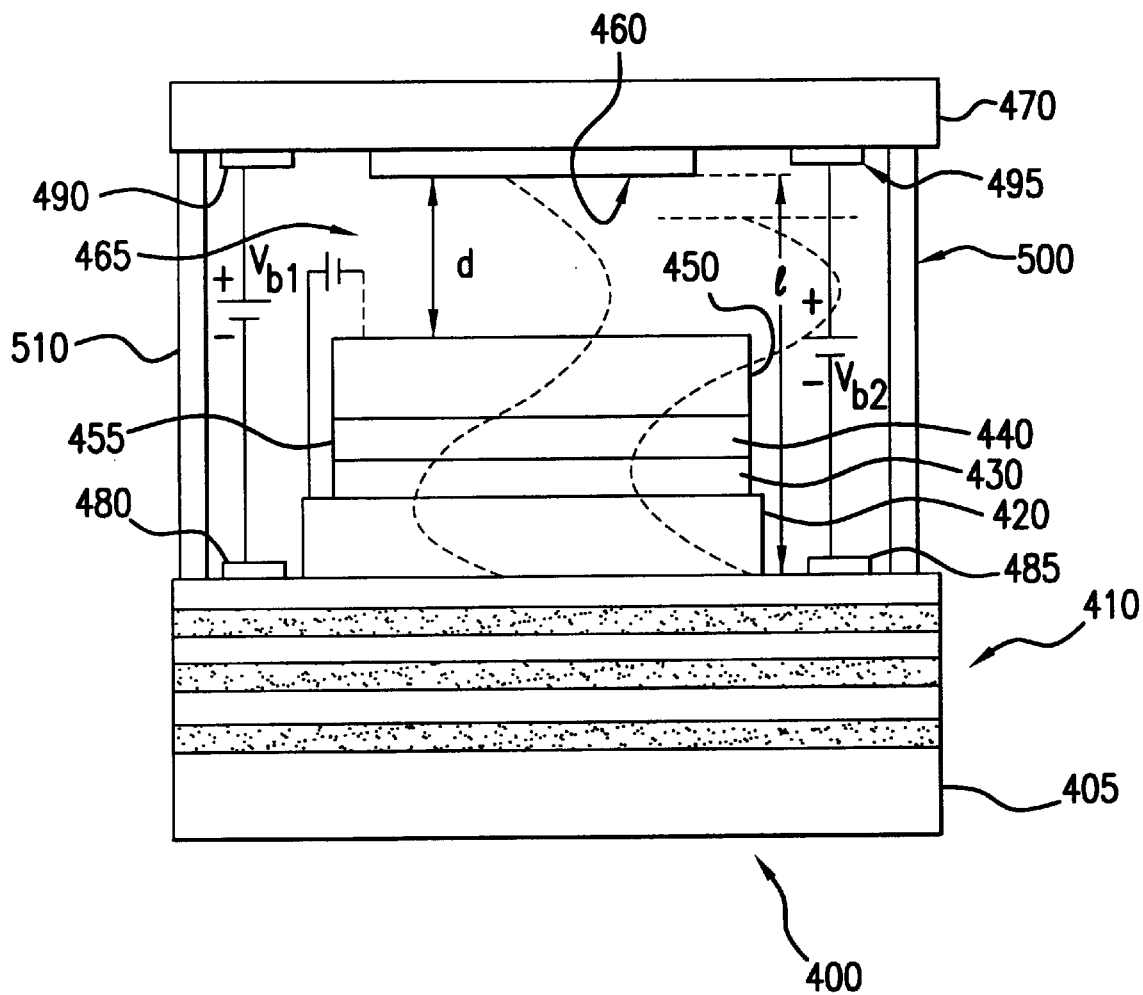
FIG. 9 illustrates a tunable RCOLED according to a second embodiment of the invention.

FIG. 9 illustrates a tunable RCOLED 400 according to a second embodiment of the invention. The RCOLED includes a glass substrate 405, a quarter-wavelength mirror stack 410, an indium tin oxide (ITO) layer 420, an emitting medium 430, a hole transport layer 440, an ITO electrode 450, an Al reflector 460, a membrane 470, electrodes 480, 485, 490, and 495 and pillars 500 and 510. The Al reflector 460 is attached to the membrane 470. The electrodes 490 and 495 are connected to the membrane 470 and the electrodes 480 and 485 are connected to the quarter-wavelength mirror stack 410. The electrode pairs 480 and 490, and 485 and 495, electrically couple the normally electrically-isolated membrane 470 and quarter-wavelength stack 410.

The pillars 500 and 510 are connected to and support the membrane 470. The pillars 500 and 510, the quarter-wavelength mirror stack 410 and the membrane 470 form a resonant cavity 465. In the resonant cavity 465, the layers 420–450 form a white light OLED 455, which is used as an emitter.

The cavity length 1 is adjusted, i.e., tuned, using bias voltages $V_{b1}$ and $V_{b2}$ applied between the electrode pair 480 and 490, and the electrode pair 485 and 495, respectively, to apply two electrostatic forces to the membrane 470 and the quarter-wavelength mirror stack 410. The dielectric quarter-wavelength mirror stack 410 is made of, for example, $SiO_2/TiO_2$. The resonant cavity 465 contains the white light OLED 455. The emitting medium 430 and the hole transport layer 440 are organic. The emitting medium 430 may be made of Alq. The hole transport layer 430 is made of TAD.

In the second RCOLED 400, the membrane 470 may be tilted to one side by providing different bias voltages $V_{b1}$ and $V_{b2}$ to the electrode pairs 480 and 490, and 485 and 495. The membrane 470 should be a few hundred nanometers thick, able to bend by 180 nanometers and able to bow or tilt by tens of nanometers. As noted above, the width of the emission spectrum produced by the RCOLED 400 is determined by the finesse of the resonant cavity 465, which is affected by the product of the reflectivities of the top and bottom mirrors, i.e., the Al reflector 460 and the quarter-wavelength mirror stack 410. The higher the product of the reflectivities, the narrower the width of the emission spectrum. By tilting the membrane 470 to one side, the finesse of the resonant cavity 465 can be greatly decreased. By decreasing the finesse, the emission spectral width is broadened. This broadening of the emission spectral width allows the emitted light to achieve color saturation. This capability is particularly advantageous in display applications.

As shown in FIG. 9, the RCOLED 400 includes the electrodes 480 and 490 on one side of the resonant cavity 465 and the electrodes 485 and 495 on the opposite side of the resonant cavity 465. As the first bias voltage $V_{b1}$ is applied to the membrane 470 using the electrodes 480 and 490, the second bias voltage $V_{b2}$ is applied to a different area of membrane 470 using the electrodes 485 and 495. When $V_{b1}$ is equal to $V_{b2}$ the second RCOLED 400 acts similar to the first RCOLED 200. When $V_{b1}$ does not equal $V_{b2}$, the membrane 470 tilts to one side because the electrostatic charge induced on the membrane 470 is different on one side of the membrane 470 induced by the voltage on one set of the electrodes 480, 490 than the electrostatic charge on the other side of the membrane 470 induced by the different voltage on the other set of the electrodes 485, 495.

As a result of tilting the membrane 470, the Al reflector 460, attached to membrane 470, also tilts relative to the surface of the quarter-wavelength mirror stack 410. As discussed above, by tilting the membrane 470 relative to the quarter-wavelength mirror stack 410, the finesse of the resonant cavity 465 is reduced and the amount of energy stored in the resonant cavity 465 decreases as well. Therefore, the intensity of the emitted light increases as the membrane 470 is tilted, until the resonant cavity 465 RCOLED 400 loses its resonant property.

Figure 10:
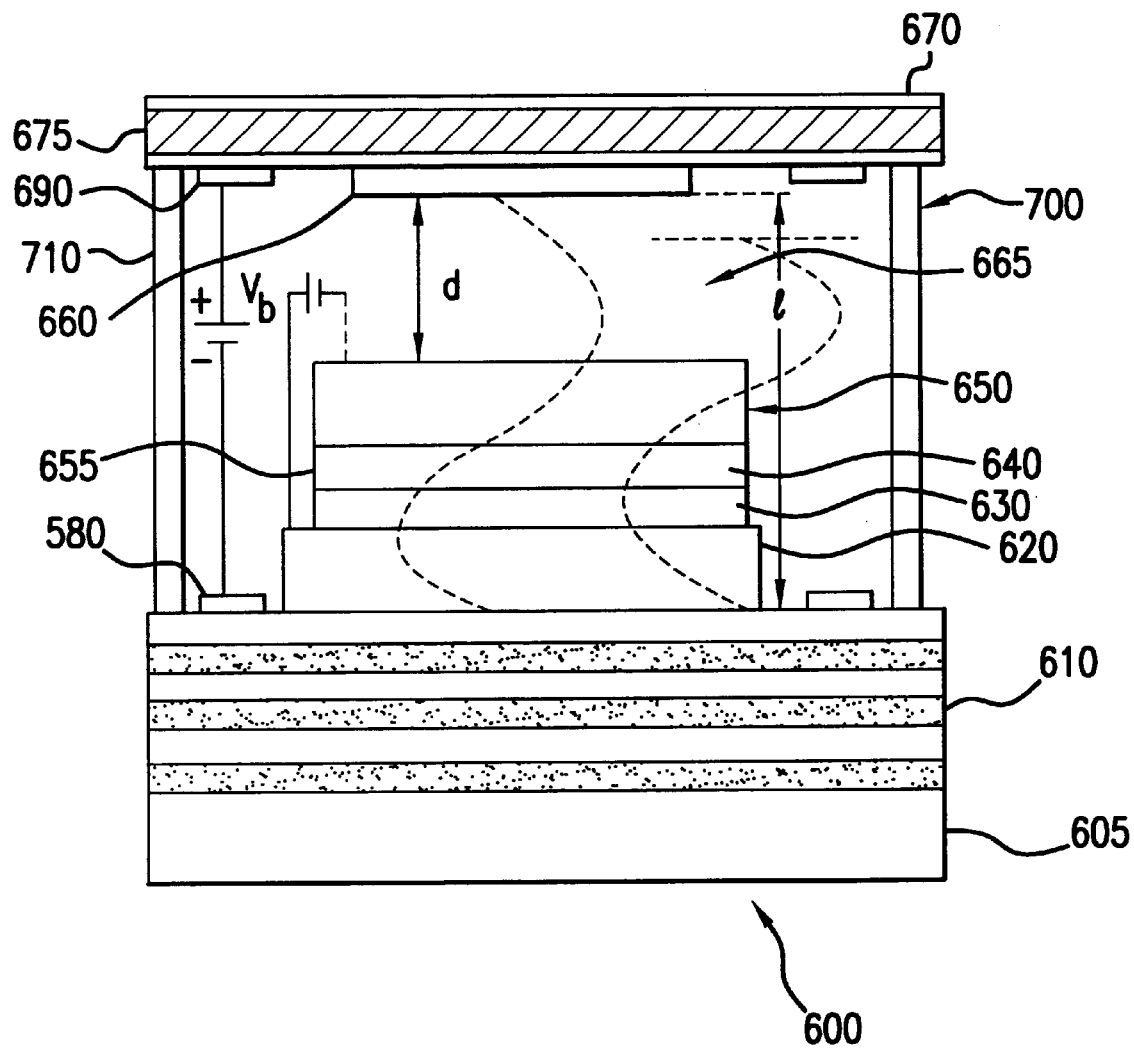
FIG. 10 illustrates a tunable RCOLED according to a third embodiment of the invention.

FIG. 10 shows a third RCOLED 600 according to this invention. In this third embodiment of the invention, the finesse of the resonant cavity is altered by bowing the membrane. Bowing generates a color shift in all directions which provides the same result as saturation.

The RCOLED 600 is substantially similar to the RCOLED 200 shown in FIG. 3, except for the piezoelectric material 675 forming the membrane 670. The constituent parts of the RCOLED 600 are the same as those of the RCOLED 200 shown in FIG. 3. The RCOLED 600 includes a glass substrate 605, a quarter-wavelength mirror stack 610, an indium tin oxide layer 620, an emitting medium 630, a hole transport layer 640 and an electrode 650, an Al reflector 660, a membrane 670, electrodes 680 and 690, and pillars 700 and 710. The Al reflector 660 is attached to the membrane 670. The electrodes 680 and 690 are connected to the membrane 670 and the quarter-wavelength mirror stack 610, respectively. The electrodes 680 and 690 electrically couple the normally electrically-isolated membrane 670 and the quarter-wavelength stack 610.

The pillars 700 and 710 are connected to and support the membrane 670. The pillars 700 and 710, the quarter-wavelength mirror stack 610 and the membrane 670 form a resonant cavity 665. In the resonant cavity 665, the layers 620–650 of the RCOLED 600 form a white light OLED 655, which is used as an emitter.

The electrodes 670 and 680 electrically couple the membrane 600 and the quarter-wavelength mirror stack 610 and may be located anywhere within the resonant cavity 665 as long as the electrodes do not interfere with the emission of light using the Al reflector 620 and the quarter-wavelength stack 610.

As shown in FIG. 10, the membrane 670 of the RCOLED 600 includes a piezoelectric material 675, such as quartz. The piezoelectric material 675 may form the entire membrane 600 or may be located in any portion of the membrane 670. The bowing is induced using a piezoelectric effect to flex the membrane 670. As the membrane 670 is bowed, if only the center region of the membrane 670 is used, the Q and the finesse remain the same. As the membrane 670 is bowmembrane 670 is usemembrane 670 is used and the pixel is not wider than the stack, then the Q and the finesse are lowered. Any variation between two flat perfect reflectors will lower the Q.

In operation of the RCOLED 600, a bias voltage $V_b$ is applied to the electrodes 680 and 690 to apply an electrostatic force between the membrane 670 and the quarter-wavelength stack 610. As a result, the piezoelectric material 675 flexes in response to the bias voltage $V_b$. The membrane 670 bows as a result of the piezoelectric effect. By bowing the membrane 670, the resonant cavity length 1 is decreased and the finesse of the resonant cavity 665 is altered. Using this RCOLED 600, it is possible to change the color of the emitted light by tuning the resonant cavity membrane 670.

Figure 11:
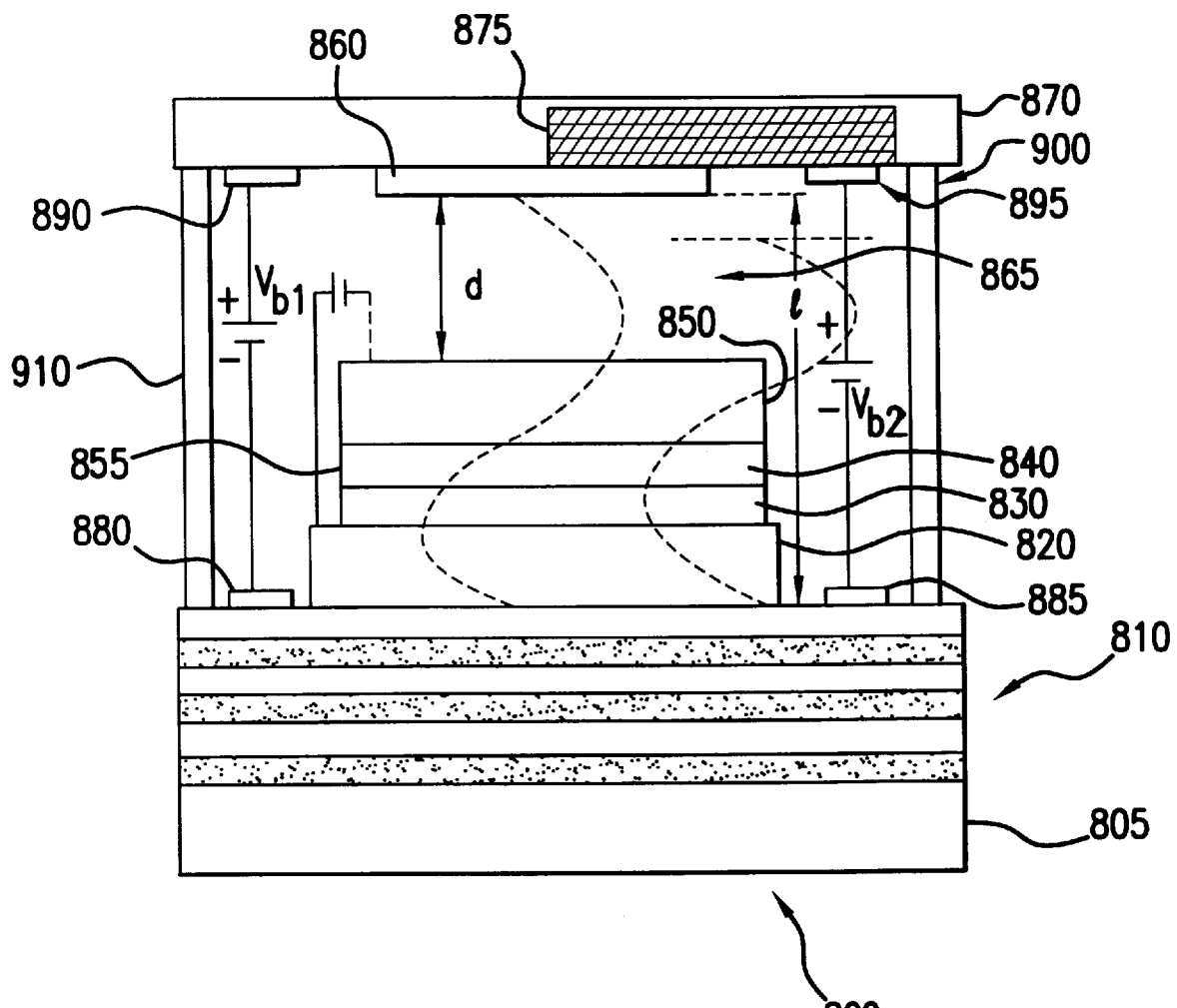
FIG. 11 illustrates a tunable RCOLED according to a fourth embodiment of the invention.

FIG. 11 shows a fourth RCOLED 800 according to this invention. In this fourth embodiment of the invention, the membrane is bowed and tilted using the piezoelectric affect of the RCOLED 600 shown in FIG. 10 and the differential electrodes of the RCOLED 400 shown in FIG. 9. As illustrated in FIG. 11, the RCOLED 800 includes a membrane 870 including at least one region 875 of piezoelectric material.

The device structure is substantially similar to the device according to the second RCOLED 400 shown in FIG. 9, except for the piezoelectric material 875 included in, or forming, the membrane 870, as shown in FIG. 11. The piezoelectric material 875 may form the entire membrane 870 or may be located in any portion of the membrane 870. More than one region 875 of piezoelectric material may be included within the membrane 870. Electrode pairs, such as the electrode pair 880 and 890, and the electrode pair 885 and 895, electrically couple the membrane 870 with the quarter-wavelength mirror stack 810. In particular, each electrode pair such as 885 and 895 electrically couples a corresponding piezoelectric region 875 with the quarter-wavelength mirror stack 810 to bow the membrane 870.

The RCOLED 800 includes a glass substrate 805, a quarter-wavelength mirror stack 810, an Al reflector 860, the membrane 870, electrodes 880, 885, 890 and 895, pillars 900 and 910, an indium tin oxide layer 820, an emitting medium 830, a hole transport layer 840 and an electrode 850. The piezoelectric material 875 may form the entire membrane 870 or may be located in any portion of the membrane 870. The Al reflector 860 is attached to the membrane 870. The electrodes 890 and 895 are connected to the membrane 870. The electrodes 880 and 885 are connected to the quarter-wavelength mirror stack 810. Therefore, the electrode pairs 880 and 890, and 885 and 895 electrically couple the membrane 870 and the quarter-wavelength stack 810.

The pillars 900 and 910 are connected to and support the membrane 870. The pillars 900 and 910, the quarter-wavelength mirror stack 810 and the membrane 800 form a resonant cavity 865. In the resonant cavity 865, the layers 820–850 of the RCOLED 800 form a white light OLED 855, which is used as an emitter.

The electrode pairs 880 and 890, and 885 and 895 electrically couple the membrane 870 and the quarter-wavelength mirror stack 810 and may be located anywhere within the resonant cavity 865 as long as the electrodes 880–895 do not interfere with the emission of light using the Al reflector 860 and the quarter-wavelength stack 810. The piezoelectric material 875 may form the entire membrane 870 or may be located in any portion of the membrane 870.

In operation of the RCOLED 800, a bias voltage $V_{b1}$ is applied to the membrane 870 using the electrode pair 880 and 890 and the membrane 870 moves towards the quarter-wavelength mirror stack 810 as in the first and third RCOLEDs 200–600 because of the electrostatic force. A bias voltage $V_{b2}$ is applied to each piezoelectric region 875 of the membrane 870 using the electrode pair 885 and 895. As a result, the piezoelectric material 875 flexes in response to the bias voltage $V_{b2}$. As a result of the application of both bias voltages $V_{b1}$ and $V_{b2}$, the membrane 870 moves toward the quarter-wavelength stack 810 and simultaneously bows as a result of the piezoelectric effect. By inducing the electric charge on the membrane 870, the cavity length 1 is decreased. By bowing the membrane 870 by applying a charge to the piezoelectric region 875, the cavity length 1 is decreased and the finesse of the resonant cavity 865 is altered.

Using this RCOLED 800, it is possible to change the color of the emission by tuning the cavity membrane 870. For example, moving the membrane towards the quarter wavelength mirror stack will change the emission wavelength of the RCOLED toward the blue wavelength. Bowing the membrane will decrease the color saturation of the light emission.

Figure 12:
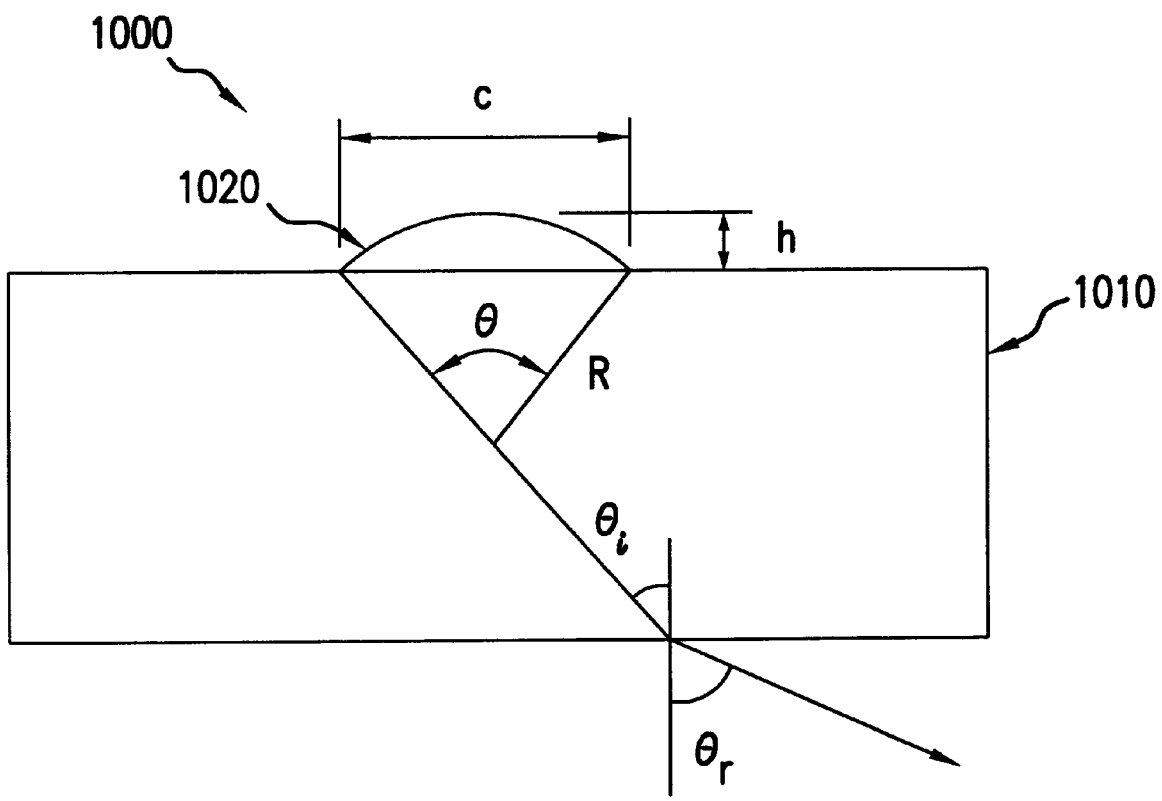
FIG. 12 illustrates a spherical microlens.
Figure 13:
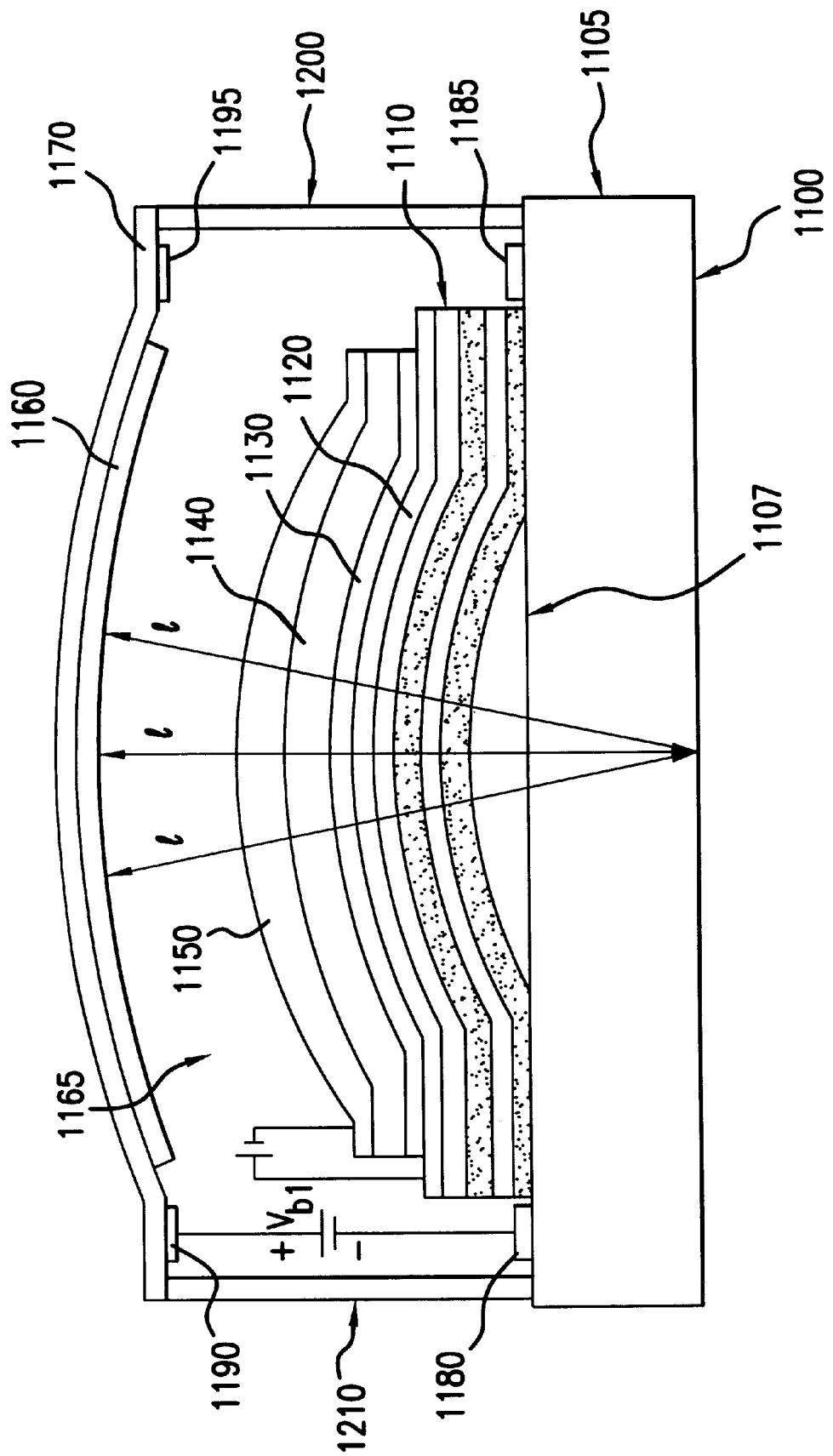
FIG. 13 illustrates a tunable RCOLED according to the fifth embodiment of the invention using the spherical microlens of FIG. 12.

FIGS. 12 and 13 show a microlens 1000 and a fifth RCOLED 1100 incorporating the microlens structure 1000. FIG. 12 illustrates a spherical microlens structure 1000 having a spherical microlens 1020 formed on a substrate 1010 in which the radius R of the sphere is 50 μm and the subtended angle is 60°. The height h of the sphere above the glass substrate 960 is R(1−cosµ)/2, or for R=50 μm, 6.75 μm.

The circumferences of the sphere is 2Rs in θ/2, or for R=50 μm, 50 μtm. As shown in FIG. 12, the light radiated from the glass substrate 1010 is refracted by an angle θ$_r$. Assuming a refractive index of the glass substrate 1010 is approximately 1.5, a 30° incidence angle produces a refractive angle of 49°. Therefore, the resulting off-axis viewing angle is 49°, without any wavelength shift or intensity drop-off. The critical angle of the glass substrate 1010 is 41° for total internal reflection. If the subtended angle is 82°, the off-axis viewing angle is 90°.

In this fifth embodiment of the invention, as shown in FIG. 13, the RCOLED 1100 is built on a microlens substrate 1105 to form a concentric resonant cavity 1165 to achieve uniform off-axis color and intensity emissions. The concentric resonant cavity 1165 provides the RCOLED 1100 with a wide viewing angle. As discussed above, OLEDs suffer from a problem that light intensity at 0° is greatly enhanced from non-cavity emission but the emission intensity drops off quickly for off-axis directions because of the spectral shift.

To solve the intensity drop-off and spectral shift problems, a scattering layer is deposited on the glass surface to scatter the on-axis light emission. To increase the efficiency of the RCOLED 1100, the resonant cavity 1165 is used to spatially and spectrally redistribute the electro-luminescent emission of the organic materials. Light emission in the forward direction from the RCOLED 1100 can be increased by four times over the light emitted from a non-cavity OLED. The spectral width of the RCOLED 1100 is also much narrower than that of the regular OLED, which means pure color in the forward direction.

The viewing angle of the diode is determined by the curvature of the spherical lens 1107. The larger the curvature, the wider the viewing angle.

As shown in FIG. 13, a spherical microlens 1107 is formed by etching a glass substrate 1105. The other constituent parts of the RCOLED 1100 are the same as in any one of the first-fourth RCOLEDs 200–800 shown in FIGS. 3 and 9–11.

Fabrication of the microlens 1107 shown in FIG. 13 is relatively simple. For example, the RCOLED 1100 may be fabricated by patterning a 50 μm diameter dot using polyimide on the glass substrate 1105. By heating and reflowing the dot, the spherical microlens 1107 can be formed. After forming the microlens 1107, a dielectric quarter-wavelength mirror stack 1110 made of, for example, $TiO_2/SiO_2$ or $SiN_x/SiO_2$, is deposited. Subsequently, the RCOLED 1100 is fabricated on the spherical lens substrate using conventional fabrication techniques.

Three pairs of quarter-wavelength mirror stack may provide an improved reflectivity of over 80%. The Al reflector 860 provides a reflectivity of over 90%. The resonant peak wave length is the same at different off-axis directions since any off-axis direction has the same resonant cavity length 1 within the concentric resonant cavity 1165. The angular light intensity distribution from the device becomes uniform.

Therefore, the RCOLED 1100 having a 6.5 μm tall and 50 μm diameter microlens 1107 provides a 50° off-axis viewing angle with uniform color and intensity distributions. The RCOLED 1100 is particularly advantageous for color display applications.

While this invention has been described in conjunction with the specific embodiments outlined above, it is evident that many alternatives, modifications and variations will be apparent to those skilled in the art. Accordingly, the preferred embodiments of the invention, as set forth above, are intended to be illustrative, not limiting. Various changes may be made without departing from the spirit and scope of the invention.

What is claimed is:

1. A full-color, tunable light emitting device comprising:
   a high-reflection membrane;
   a high-reflection dielectric mirror, the high-reflection membrane and the high-reflection dielectric mirror forming a resonant cavity; and
   a white-light emitting device located in the resonant cavity;
   wherein a distance between the high-reflection membrane and the high-reflection dielectric mirror varies.

2. The full-color, tunable light emitting device of claim 1, wherein the full-color tunable light emitting device is a resonant cavity organic light emitting diode.

3. The full-color, tunable light emitting device of claim 1, wherein the high-reflection membrane comprises a reflective layer coupled to a flexible layer.

4. The full-color, tunable light emitting device of claim 3, further comprising an electrode pair that induces an electrostatic force on the flexible layer to move the high-reflection membrane towards the high-reflection dielectric mirror to vary the distance between the high-reflection membrane and the high-reflection dielectric mirror.

5. The full-color, tunable light emitting device of claim 3, wherein the flexible layer includes a region of piezoelectric material.

6. The full-color, tunable light emitting device of claim 5, further comprising a first electrode coupled to the flexible layer, the first electrode applying a bias voltage to the piezoelectric region that induces the piezoelectric region to flex to vary the distance between the high-reflection membrane and the high-reflection dielectric mirror.

7. The full-color, tunable light emitting device of claim 6, further comprising a second electrode coupled to the flexible layer, the second electrode applying a second bias voltage to the flexible layer that induces an electrostatic force on the flexing layer to move the high-reflection membrane towards the high-reflection dielectric mirror to vary the distance between the high-reflection membrane and the high-reflection dielectric mirror.

8. The full color tunable light emitting device of claim 3, wherein the flexible layer includes a plurality of regions of piezoelectric material.

9. The full-color, tunable light emitting device of claim 8, further comprising a first electrode electrically coupled to a first one of the plurality of piezoelectric material regions, the first electrode applying a first bias voltage to the first piezoelectric material region that induces the first piezoelectric region to flex to vary the distance between the high-reflection membrane and the high-reflection dielectric mirror.

10. The full-color, tunable light emitting device of claim 9, further comprising a second electrode electrically coupled to a second one of the plurality of piezoelectric material regions, the second electrode applying a second bias voltage to the second piezoelectric material region that induces the second piezoelectric region to flex to vary the distance between the high-reflection membrane and the high-reflection dielectric mirror.

11. The full-color, tunable light emitting device of claim 10, wherein the first and second bias voltages are different.

12. The full-color, tunable light emitting device of claim 1, wherein the high-reflection membrane is tiltable to alter the finesse of the resonant cavity.

13. The full-color, tunable light emitting device of claim 1, wherein the high-reflection membrane is bowable to alter the finesse of the resonant cavity.

14. The full-color, tunable light emitting device of claim 1, further comprising:
- a glass substrate over which the high-reflection dielectric mirror is formed;
- a first contact layer over the high-reflection dielectric mirror;
- an emitting medium over the first contact layer;
- a hole transport layer over the emitting medium;
- a second contact layer over the hole transport layer and electrically coupled to the first contact layer;
- a pillar connected to and supporting the high-reflection membrane; and
- an electrode electrically coupled to the high-reflection membrane, the electrode applying a bias voltage to the high-reflection membrane to vary the distance between the high-reflection membrane and the high-reflection dielectric mirror.

15. The full-color, tunable light emitting device of claim 14, further comprising a microlens structure formed between the glass substrate and the high-reflection dielectric mirror.

16. The full-color, tunable light emitting device of claim 1, further comprising:
- a glass substrate over which the high-reflection dielectric mirror is formed; and
- a microlens structure disposed between the glass substrate and the high-reflection dielectric mirror.

17. A method for producing full-color, tunable light, the method comprising:
- providing a high-reflection membrane in a spaced relationship with a high-reflection dielectric mirror, the high-reflection membrane and high-reflection dielectric mirror forming a resonant cavity;
- emitting white light from a white light emitting device located in the resonant cavity;
- varying the distance between the high-reflection membrane and the high-reflection dielectric mirror to vary a color of light emitted from the resonant cavity.

18. The method of claim 17, wherein varying the distance between the high-reflection membrane and the high-reflection dielectric mirror comprises:
- applying a bias voltage to the high-reflection membrane;
- inducing an electrostatic charge on the high-reflection membrane based on the applied bias voltage; and
- varying the distance between the high-reflection membrane and the high-reflection dielectric mirror based on the induced electrostatic force.

19. The method of claim 17, wherein varying the distance between the high-reflection membrane and the high-reflection dielectric mirror comprises:
- applying a first bias voltage to a first piezoelectric region of the high-reflection membrane to flex the membrane thereby varying the distance between the high-reflection membrane and the high-reflection dielectric mirror.

20. The method of claim 19, wherein varying the distance between the high-reflection membrane and the high-reflection dielectric mirror further comprises:
- applying a second bias voltage to a second piezoelectric region of the high-reflection membrane to flex the membrane thereby varying the distance between the high-reflection membrane and the high-reflection dielectric mirror.

21. The method of claim 18, wherein varying the distance between the high-reflection membrane and the high-reflection dielectric mirror further comprises:
- applying a first bias voltage to a first piezoelectric region of the high-reflection membrane to flex the membrane thereby varying the distance between the high-reflection membrane and the high-reflection dielectric mirror.

22. A full-color, tunable light emitting device comprising:
- a high-reflection movable membrane;
- a high-reflection dielectric mirror, the high-reflection membrane and the high-reflection dielectric mirror forming a resonant cavity; and
- a white-light emitting device located in the resonant cavity;
- wherein the high-reflection movable membrane to adjust a distance between the high-reflection movable membrane and the high-reflection dielectric mirror.

23. A full-color, tunable light emitting device comprising:
- means for providing a resonant cavity;
- means for emitting light in the resonant cavity; and
- means for adjusting a length of the resonant cavity.

24. A full-color, tunable light emitting device comprising:
- a high-reflection movable membrane;
- a high-reflection dielectric mirror, the high-reflection membrane and the high-reflection dielectric mirror forming a resonant cavity; and
- a white-light emitting device located in the resonant cavity;
- wherein the high-reflection movable membrane moves to adjust a distance between the high-reflection movable membrane and the high-reflection dielectric mirror.

25. The full-color, tunable light emitting device of claim 24 incorporated in an image forming device, the image forming device selected from the group consisting of:
- a scanner;
- a facsimile machine;
- a printer;
- a digital copier;
- a raster output scanner;
- an image bar; and
- a flat panel display.

26. An image forming device including a full-color, tunable light emitting device comprising:
- a high-reflection membrane;
- a high-reflection dielectric mirror, the high-reflection membrane and the high-reflection dielectric mirror forming a resonant cavity; and
- a white-light emitting device located in the resonant cavity;
- wherein a distance between the high-reflection membrane and the high-reflection dielectric mirror varies.

27. The image forming apparatus of claim 25, wherein the image forming device is selected from the group consisting of:
- a scanner;
- a facsimile machine;
- a printer;
- a digital copier;
- a raster output scanner;
- an image bar; and
- a flat panel display.

* * * * *